(12) United States Patent
Park et al.

(10) Patent No.: US 7,682,872 B2
(45) Date of Patent: Mar. 23, 2010

(54) INTEGRATED CIRCUIT PACKAGE SYSTEM WITH UNDERFILL

(75) Inventors: SooMoon Park, Jinju-si (KR); Tae Keun Lee, Ichon-si (KR); YoRim Lee, Koyang-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/037,084

(22) Filed: Feb. 25, 2008

(65) Prior Publication Data
US 2008/0211111 A1 Sep. 4, 2008

Related U.S. Application Data

(60) Provisional application No. 60/892,836, filed on Mar. 2, 2007.

(51) Int. Cl.
*H01L 21/00* (2006.01)
(52) U.S. Cl. .............................. 438/108; 257/E23.001; 257/E21.499
(58) Field of Classification Search .................. 257/778, 257/E23.003, E23.004, E21.502, E21.503, 257/E21.504, E23.001, E21.499; 438/108, 438/106, 107
See application file for complete search history.

(56) References Cited

U.S. PATENT DOCUMENTS

| | | | |
|---|---|---|---|
| 5,710,071 A * | 1/1998 | Beddingfield et al. | 438/108 |
| 6,320,127 B1 | 11/2001 | Nagarajan et al. | |
| 6,706,553 B2 * | 3/2004 | Towle et al. | 438/106 |
| 6,838,758 B1 * | 1/2005 | Montiel | 257/678 |
| 7,102,239 B2 | 9/2006 | Pu et al. | |
| 7,179,683 B2 | 2/2007 | Low et al. | |
| 2006/0046352 A1 * | 3/2006 | Low et al. | 438/127 |

FOREIGN PATENT DOCUMENTS

JP 11-150206 6/1999

OTHER PUBLICATIONS

Cui et al., "Enhancing Adhesion between Mold Compound and Substrate in BGA Packaging." Electronic Components and Technology Conference (1997): pp. 544-549.*

* cited by examiner

*Primary Examiner*—Matthew Smith
*Assistant Examiner*—Michele Fan
(74) *Attorney, Agent, or Firm*—Mikio Ishimaru

(57) ABSTRACT

An integrated circuit package system includes: providing a package carrier; forming a first channel in the package carrier; mounting a first integrated circuit device over the package carrier and adjacent to the first channel; mounting a second integrated circuit device over the package carrier and adjacent to the first channel; and forming a contiguous underfill fillet with the first channel and under both the first integrated circuit device and the second integrated circuit device.

18 Claims, 3 Drawing Sheets

INTEGRATED CIRCUIT PACKAGE SYSTEM WITH UNDERFILL

CROSS-REFERENCE TO RELATED APPLICATION

This application claims the benefit of U.S. Provisional Patent Application Ser. No. 60/892,836 filed Mar. 2, 2007.

TECHNICAL FIELD

The present invention relates generally to integrated circuit package systems, and more particularly to a system for providing underfill between substrates and integrated circuits.

BACKGROUND ART

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

Integrated circuit (IC) chips or die are typically assembled into an integrated circuit package that is soldered to a printed circuit board (PCB). A chip or die may have contacts on one surface (e.g., such as a field or array of contacts) that are electrically connected to a first set of contacts on one surface of an electronic device package (e.g., such as a chip or die package), and there may be another set of contacts on the package for connection to a PCB, such as a mother board. Thus, a circuit device, such as a chip or a die can be assembled into a package on a substrate, strip, or wafer having multiple packages. Once the packages are assembled, each package may be separated from the other packages and subsequently attached to a PCB. Electronic access to and operation of circuit devices, such as circuit devices on a semiconductor (e.g., silicon) substrate, may be provided by one set of solder balls and/or contact wires between the circuit device and a circuit device package, and a second set of solder balls between the package and contacts of another electronic device (e.g., such as a PCB).

During manufacture and assembly, such a package may experience thermal variation and vertical tensile strain. In addition, the package may include materials having various coefficients of thermal expansion (CTE). For example, multiple packages may be formed or mounted on a substrate, strip, or wafer by mounting a circuit device at each of the package locations, filling the space between the circuit device and the location with an underfill material, and then coating the circuit device and location with a mold material. Subsequently, each package location including the circuit device mounted therein, may be singulated, or separated from the other packages and to form a single package for attaching to a PCB or motherboard.

Therefore, there may be CTE mismatches between a substrate on which packages are manufactured (e.g., such as a substrate on which multiple circuit devices are assembled to multiple package locations, underfilled, and molded), the circuit devices themselves, the material of the underfill layer (e.g., filling the gap between the circuit devices and the substrate), and the mold material (e.g., such as material to seal out moisture, formed over the circuit devices, package locations, and fill material).

Furthermore, voids or irregularities may exist in the underfill layer. Thus, a substrate having a number of packages formed thereon at package locations may experience warping or bowing depending on the degree of CTE mismatches between the materials mentioned above, the thicknesses of the materials, the number of packages formed on the substrate, the space between the packages, the quality of the underfill layer and the number and intensity of thermal variations experienced during manufacture of the packages and assembly of the circuit devices to the packages. This warping may cause delamination or bowing of layers of the package and of the circuit devices assembled into the packages.

Dispenser needle location and movement are the important factors for avoiding voids and/or gaps in the underfill layer while also preventing epoxy overflow to the top of the circuit device die during processing. Additional underfill processing complications may be introduced when two or more adjacent circuit device dies are mounted on the same substrate. For example, additional care must be taken when dispensing underfill material to avoid underflow volume imbalance. Furthermore, slow underfilling speed may occur due to die size, bump pitch, and/or bump height differences.

Thus, a need still remains for improved packages. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a package carrier; forming a first channel in the package carrier; mounting a first integrated circuit device over the package carrier and adjacent to the first channel; mounting a second integrated circuit device over the package carrier and adjacent to the first channel; and forming a contiguous underfill fillet with the first channel and under both the first integrated circuit device and the second integrated circuit device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
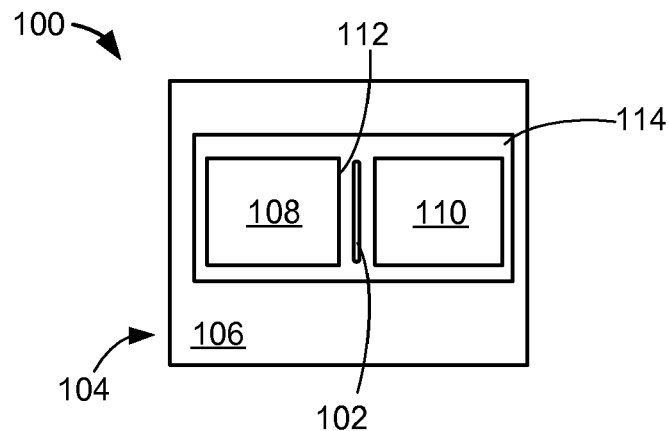
FIG. 1 is a top view of an integrated circuit package system in a first embodiment of the current invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the current invention. The top view depicts a first channel 102, formed in a package carrier 104 coated with a patterned layer of solder resist 106. In this example, the first channel 102 is an underfill channel formed in the patterned layer of the solder resist 106.

A first integrated circuit device 108 and a second integrated circuit device 110 are mounted over the package carrier 104 and adjacent to the first channel 102 without covering the first channel 102. In this example, both the first integrated circuit device 108 and the second integrated circuit device 110 are shown as flip chips. In this example, the first channel 102 does not extend beyond a first side 112 of the first integrated circuit device 108.

A contiguous underfill fillet 114 is formed between the package carrier 104 and the first integrated circuit device 108 and, between the package carrier 104 and the second integrated circuit device 110. For example, the contiguous underfill fillet 114 may comprise a molding compound, a resin, and/or a non-conductive epoxy.

Figure 2:
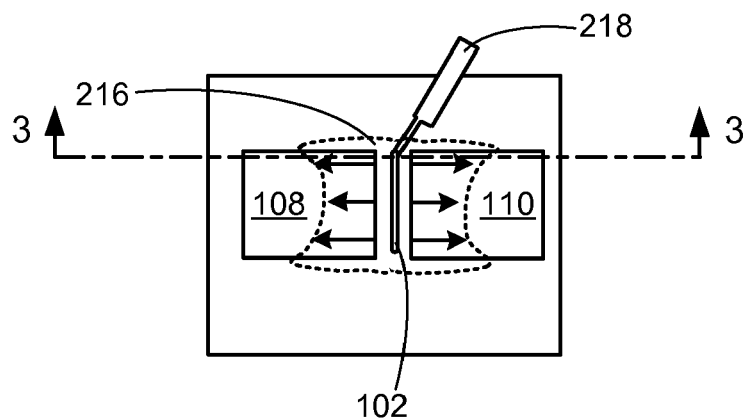
FIG. 2 is a top view of an intermediate structure of the integrated circuit package system of FIG. 1.

Referring now to FIG. 2, therein is shown a top view of an intermediate structure of the integrated circuit package system 100 of FIG. 1. This view illustrates the integrated circuit package system 100 of FIG. 1 as the contiguous underfill fillet 114 of FIG. 1 is being formed by dispensing an underfill material 216. A dispenser tip 218 applies the underfill material 216 over the first channel 102. The underfill material 216 spreads from the first channel 102 towards and below the first integrated circuit device 108 and the second integrated circuit device 110. The underfill material 216 may include one or more liquids such as an underfill precursor. The underfill material 216 dispensed, may flow before it reacts, sets, or is cured into the final form of the contiguous underfill fillet 114 illustrated in FIG. 1. It is understood that in some cases, the underfill material 216 may be dispensed in two or more steps. The final composition of the contiguous underfill fillet 114 illustrated in FIG. 1 is not necessarily uniform.

Figure 3:
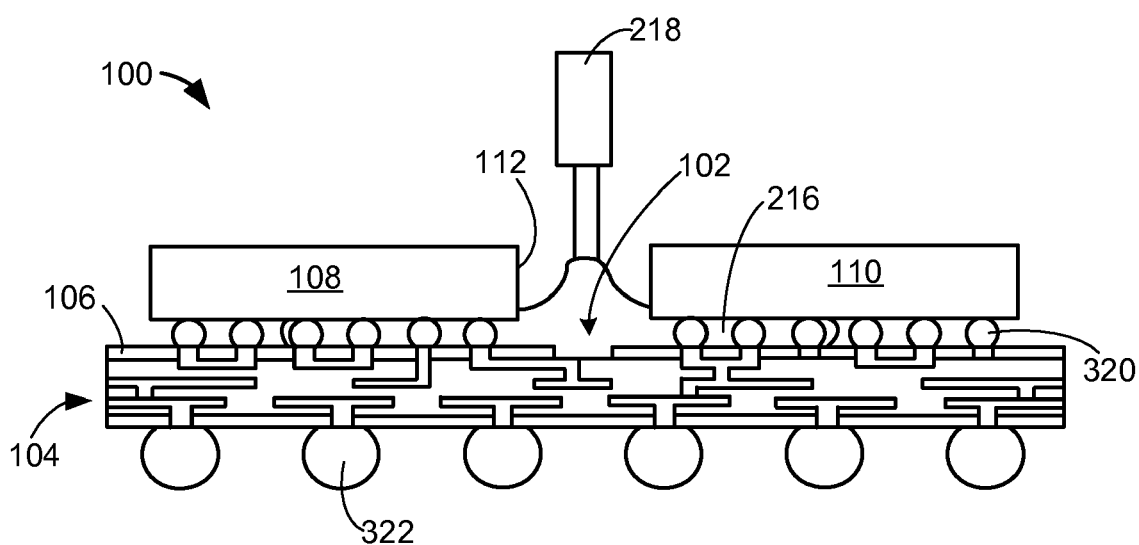
FIG. 3 is a cross-sectional view of an intermediate structure of the integrated circuit package system along line 3-3 of FIG. 2.

Referring now to FIG. 3, therein is shown a cross-sectional view of an intermediate structure of the integrated circuit package system 100 along line 3-3 of FIG. 2. The cross-sectional view illustrates the integrated circuit package system 100 as the contiguous underfill fillet 114 of FIG. 1 is being formed with the underfill material 216 being dispensed from the dispenser tip 218. In this example, the first integrated circuit device 108 and the second integrated circuit device 110 are both mounted over the package carrier 104 and adjacent to the first channel 102 and are coupled to the package carrier 104 with internal connective elements 320 such as solder bumps. External connective elements 322, such as solder balls, are attached to a bottom side of the package carrier 104 for connection to the next system level (not shown), such as a printed circuit board. The external connective elements 322 are optional.

In this example, the first channel 102 includes the patterned layer of the solder resist 106 and the cross-sectional profile of the first channel 102 is substantially rectangular. The contiguous underfill fillet 114 of FIG. 1 may be formed between the package carrier 104 and the first integrated circuit device 108 and the second integrated circuit device 110 when the dispenser tip 218, dispenses the underfill material 216 over or near the first channel 102. The flow of the underfill material 216 beneath the first integrated circuit device 108 and the second integrated circuit device 110 may be enhanced by capillary action.

For the example illustrated in FIG. 1, FIG. 2 and FIG. 3, the first integrated circuit device 108 and the second integrated circuit device 110 are both shown as flip chips. However, it is understood that the first integrated circuit device 108 and/or the second integrated circuit device 110 can be other integrated circuit devices such as packaged integrated circuits. In some cases, each packaged integrated circuit can include one or more integrated circuits. Furthermore, it is understood that for various embodiments of the present invention, the first integrated circuit device 108 and the second integrated circuit device 110 can be different, such as different in size, shape, and/or type of integrated circuit devices.

In FIG. 2 and FIG. 3, the dispenser tip 218 is illustrated as an example. However, it is understood that two or more dispenser tips may be used in conjunction with various embodiments of the current invention. Furthermore, other techniques for introducing underfill material may be used in conjunction with the current invention. For example, in some cases, one or more dispenser needles and/or jets may be used instead of or in addition to dispenser tips.

In FIG. 2, the dispenser tip 218 is positioned at the end of the first channel 102. However, it is understood that for some embodiments of the current invention, the underfill material 216 may be introduced to the first channel 102 anywhere along the length of the first channel 102 using one or more mechanisms. This provides flexibility in the positioning of dispensing mechanisms such as dispenser tips, needles, and/or jets.

For the example illustrated in FIG. 1, FIG. 2, and FIG. 3, the first channel 102 does not extend beyond the first side 112 of the first integrated circuit device 108. However, in some embodiments of the current invention, the first channel 102 may extend beyond the first side 112 of the first integrated circuit device 108. However, the first channel 102 does not form a closed loop encircling the first integrated circuit device 108.

For the example illustrated in FIG. 1, FIG. 2 and FIG. 3, the first channel 102 can be formed in the patterned layer of the solder resist 106 and the cross-sectional profile of the first channel 102 is substantially rectangular. However it is understood that in various embodiments of the current invention, the first channel 102 may be formed using a variety of materials, such as in a ceramic substrate. Furthermore, the cross-sectional profile of the first channel 102 can be formed in other geometric configurations, such as a U-shaped or V-shaped channel. The shape of the cross-sectional profile can also be somewhat irregular. For example, the shape of the cross-sectional profile may be an artifact of the processing methods used to form the first channel 102 and/or subsequent processing steps.

For the example illustrated in FIG. 1, FIG. 2, and FIG. 3, the first integrated circuit device 108 and the second integrated circuit device 110 are both mounted to the package carrier 104 with the internal connective elements 320. In this example, the internal connective elements 320 are illustrated as uniform solder bumps. The solder bumps under the first integrated circuit device 108 and the solder bumps under the second integrated circuit device 110 are the same height, shape, size, and distribution. However, it is understood that in other embodiments of the current invention, the height, shape, size, and/or distribution of the internal connective elements 320 may or may not be the same for the first integrated circuit device 108 and the second integrated circuit device 110.

As mentioned earlier, the external connective elements 322, such as solder balls, are attached to a bottom side of the package carrier 104 for connection to the next system level (not shown), such as a printed circuit board. However, it is understood that in various embodiments of the current invention, the external connective elements 322 may be attached after the contiguous underfill fillet 114 of FIG. 1 is formed.

Figure 4:
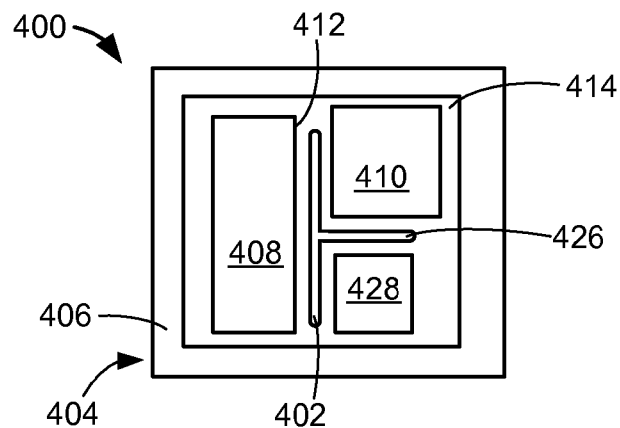
FIG. 4 is a top view of an integrated circuit package system in a second embodiment of the current invention.

Referring now to FIG. 4, therein is shown a top view of an integrated circuit package system 400 in a second embodiment of the current invention. The top view depicts a first channel 402 and a second channel 426, formed in a package carrier 404 coated with a patterned layer of solder resist 406. In this example, the first channel 402 and the second channel 426 are both underfill channels formed in the patterned layer of the solder resist 406. In this example, the second channel 426 is substantially perpendicular to the first channel 402.

A first integrated circuit device 408 and a second integrated circuit device 410 are mounted over the package carrier 404 and adjacent to the first channel 402 without covering the first channel 402 and the second channel 426. The third integrated circuit device 428 is mounted over the package carrier 404 and adjacent to the first channel 402 without covering the first channel 402 and the second channel 426. The third integrated circuit device 428 is optional. In this example, the first integrated circuit device 408 is shown as a multi-chip integrated device package; both the second integrated circuit device 410 and the third integrated circuit device 428 are shown as flip chips. In this example, the first channel 402 does not extend beyond a first side 412 of the first integrated circuit device 408.

A contiguous underfill fillet 414 is formed between the package carrier 404 and the first integrated circuit device 408, between the package carrier 404 and the second integrated circuit device 410, and between the package carrier 404 and the third integrated circuit device 428. For example, the contiguous underfill fillet 414 may comprise a molding compound, a resin, and/or a non-conductive epoxy.

Figure 5:
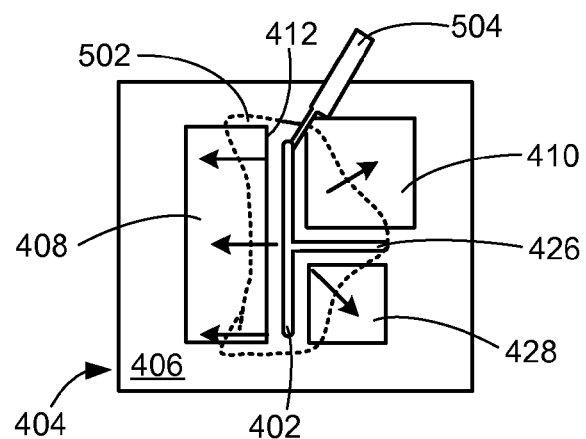
FIG. 5 is a top view of an intermediate structure of the integrated circuit package system of FIG. 4.

Referring now to FIG. 5, therein is shown a top view of an intermediate structure of the integrated circuit package system 400 of FIG. 4. This view illustrates the integrated circuit package system 400 of FIG. 4 as the contiguous underfill fillet 414 of FIG. 4 is being formed by dispensing an underfill material 502. A dispenser tip 504 applies the underfill material 502 over the first channel 402. The underfill material 502 spreads from the first channel 402 towards and below the first integrated circuit device 408, the second integrated circuit device 410 and the third integrated circuit device 428. The underfill material 502 can include one or more liquids such as an underfill precursor. The underfill material 502 dispensed, can flow before it reacts, sets or is cured into the final form of the contiguous underfill fillet 414 illustrated in FIG. 4. It is understood that in some cases, the underfill material 502 may be dispensed in two or more steps. The final composition of the contiguous underfill fillet 414 illustrated in FIG. 4 is not necessarily uniform.

For the integrated circuit package system 400 of FIG. 4, the first integrated circuit device 408, the second integrated circuit device 410 and the third integrated circuit device 428 are mounted over the package carrier 404 and adjacent to the first channel 402. The first integrated circuit device 408, the second integrated circuit device 410 and the third integrated circuit device 428 are coupled to the package carrier 404 with internal connective elements such as solder bumps (not shown).

For the embodiment illustrated in FIG. 4, the first channel 402 and the second channel 426 can be formed in the patterned layer of the solder resist 406 and the cross-sectional profiles (not shown) of both the first channel 402 and the second channel 426 are substantially rectangular. The contiguous underfill fillet 414 can be formed between the package carrier 404 and the first integrated circuit device 408, the second integrated circuit device 410 and the third integrated circuit device 428 when the dispenser tip 504 dispenses the underfill material 502 into the first channel 402. The flow of the underfill material 502 beneath the first integrated circuit device 408, the second integrated circuit device 410 and the third integrated circuit device 428 may be enhanced by capillary action. The underfill material 502 can also flow into the second channel 426, which may help spread the underfill material 502.

In FIG. 5, the dispenser tip 504 is illustrated as an example. However, it is understood that two or more dispenser tips may be used in conjunction with various embodiments of the current invention. Furthermore, other techniques for introducing the underfill material 502 may be used in conjunction with the current invention. For example, in some cases, one or more dispenser needles and/or jets may be used instead of or in addition to dispenser tips.

In FIG. 5, the dispenser tip 504 is positioned at the end of the first channel 402. However, it is understood that for some embodiments of the current invention, the underfill material 502 may be introduced to the first channel anywhere along the length of the first channel 402 using one or more mechanisms. Furthermore, in some cases, the underfill material 502 may be introduced into the first channel 402 by dispensing the underfill material 502 into the second channel 426 and allowing the underfill material 502 to flow into the first channel 402. This provides flexibility in the positioning of dispensing mechanisms such as dispenser tips, needles, and/or jets.

For the example illustrated in FIG. 4 and FIG. 5, the first channel 402 does not extend beyond the first side 412 of the first integrated circuit device 408. However, in some embodiments of the current invention, the first channel 402 may extend beyond the first side 412 of the first integrated circuit device 408. However, the first channel 402 does not form a closed loop encircling the first integrated circuit device 408.

For the example illustrated in FIG. 4 and FIG. 5, the first channel 402 and the second channel 426 can be formed in the patterned layer of the solder resist 406 and the cross-sectional profiles of both the first channel 402 and the second channel 426 are substantially rectangular. However it is understood that in various embodiments of the current invention, the first channel 402 and/or the second channel 426 may be formed using a variety of materials such as in a ceramic substrate. Furthermore, the cross-sectional profile of the first channel 402 and/or the second channel 426 can be formed in other geometric configurations, such as a U-shaped or V-shaped channel. The shape of the cross-sectional profile can also be somewhat irregular. For example, the shape of the cross-sectional profile may be an artifact of the processing methods used to form the first channel 402 and/or the second channel 426 and/or subsequent processing steps.

Figure 6:
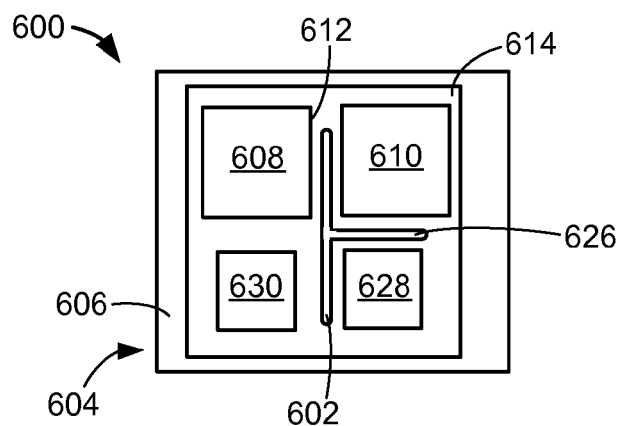
FIG. 6 is a top view of an integrated circuit package system in a third embodiment of the current invention.

Referring now to FIG. 6, therein is shown a top view of an integrated circuit package system 600 in a third embodiment of the current invention. The top view depicts a first channel 602 and a second channel 626, formed in a package carrier 604 coated with a patterned layer of solder resist 606. In this example, the first channel 602 and the second channel 626 are both underfill channels formed in the patterned layer of the solder resist 606. In this example, the second channel 626 is substantially perpendicular to the first channel 602.

A first integrated circuit device 608, a second integrated circuit device 610, a third integrated circuit device 628, and a fourth integrated circuit device 630 are mounted over the package carrier 604 and adjacent to the first channel 602 without covering the first channel 602. In this example, both the first integrated circuit device 608 and the second integrated circuit device 610 are shown as multi-chip integrated device packages; both the third integrated circuit device 628 and the fourth integrated circuit device 630 are shown as flip chips. In this example, the first channel 602 extends beyond a first side 612 of the first integrated circuit device 608.

A contiguous underfill fillet 614 is formed between the package carrier 604 and the first integrated circuit device 608, between the package carrier 604 and the second integrated circuit device 610, between the package carrier 604 and the third integrated circuit device 628 and between the package carrier 604 and the fourth integrated circuit device 630. For example, the contiguous underfill fillet 614 may comprise a molding compound, a resin, and/or a non-conductive epoxy.

The contiguous underfill fillet 614 can be formed by dispensing the underfill material 502 of FIG. 5. The dispenser tip 504 of FIG. 5 applies the underfill material 502 over the first channel 602. The underfill material 502 can include one or more liquids such as an underfill precursor. The underfill material 502 can flow before it reacts, sets, or is cured into the final form of the contiguous underfill fillet 614. The underfill material 502 spreads from the first channel 602 towards and below the first integrated circuit device 608, the second integrated circuit device 610, the third integrated circuit device 628, and the fourth integrated circuit device 630. The underfill material 502 can also flow into the second channel 626, which may help spread the underfill material 502.

For the integrated circuit package system 600 of FIG. 6, the first integrated circuit device 608, the second integrated circuit device 610, the third integrated circuit device 628 and the fourth integrated circuit device 630 are mounted over the package carrier 604 and adjacent to the first channel 602. The first integrated circuit device 608, the second integrated circuit device 610, the third integrated circuit device 628 and the fourth integrated circuit device 630 are coupled to the package carrier 604 with internal connective elements such as solder bumps (not shown). In this example, the first channel 602 and the second channel 626 can be formed in the patterned layer of the solder resist 606 and the cross-sectional profiles of both the first channel 602 and the second channel 626 are substantially rectangular.

The contiguous underfill fillet 614 may be formed between the package carrier 604 and the first integrated circuit device 608, the second integrated circuit device 610, the third integrated circuit device 628 and the fourth integrated circuit device 630 when one or more dispenser tips (not shown), dispense underfill material (not shown) into the first channel 602. The flow of the underfill material 502 beneath the first integrated circuit device 608, the second integrated circuit device 610, the third integrated circuit device 628, and the fourth integrated circuit device 630 may be enhanced by capillary action. The underfill material 502 can also flow into the second channel 626, which may help spread the underfill material 502.

It is understood that a variety of techniques for introducing underfill material may be used in conjunction with the current invention. For example, in some cases, one or more dispenser needles and/or jets may be used instead of or in addition to dispenser tips. Furthermore, it is understood that for some embodiments of the current invention, the underfill material 502 may be introduced to the first channel 602 anywhere along the length of the first channel 602. Furthermore, in some cases, the underfill material 502 may be introduced into the first channel 602 by dispensing the underfill material 502 into the second channel 626 and allowing the underfill material 502 to flow into the first channel 602. This provides flexibility in the positioning of dispensing mechanisms such as dispenser tips, needles, and/or jets.

The first channel 602 extends beyond the first side 612 of the first integrated circuit device 608. However, the first channel 602 does not form a closed loop encircling the first integrated circuit device 608. For example, the first channel 602 and the second channel 626 can be formed in the patterned layer of the solder resist 606 and the cross-sectional profiles of both the first channel 602 and the second channel 626 are substantially rectangular. However it is understood that in various embodiments of the current invention, the first channel 602 and/or the second channel 626 may be formed using a variety of materials such as in a ceramic substrate.

Furthermore, the cross-sectional profile of the first channel 602 and/or the second channel 626 can be formed in other geometric configurations, such as a U-shaped or V-shaped channel. The shape of the cross-sectional profile can also be somewhat irregular. For example, the shape of the cross-sectional profile may be an artifact of the processing methods used to form the first channel 602 and/or the second channel 626 and/or subsequent processing steps.

Other configurations for the first channel 602, the second channel 626, and/or any additional channels would be evident based on the locations of the integrated circuit device(s) and this disclosure.

For various embodiments of the current invention, the first channel 602, the second channel 626, and/or any additional channels as discussed above can include an underfill channel which can act as a reservoir for the underfill material 502 of FIG. 5. For example, an underfill channel may supply extra amount of the underfill material 502 as the contiguous underfill fillet 614 is formed; similarly, underfill channel(s) may help prevent overflow of the underfill material 502 into undesirable areas.

In some cases, the amount of the underfill material 502 required to form the contiguous underfill fillet 614 can be sensitive to variations in the internal connective elements 320 of FIG. 3, such as solder bumps. For example, solder bumps may be malformed or collapsed; variations in bump height and/or bump shape may occur by design or unintentionally during manufacture. In some cases, adjacent integrated circuit devices may have differing underfill material volume and/or underfill material flow requirements due to designed in bump height, shape, or distribution parameters.

A reservoir such as the first channel 602, the second channel 626, and/or any additional channels according to the current invention may mitigate the effects of such variations. In some cases, this may result in relaxed manufacturing control and/or feedback requirements when dispensing the underfill material 502. For example, manufacturing control and/or feedback requirements may be relaxed in relation to flow volumes, flow rates, and/or materials properties of the underfill material 502 such as viscosity.

When multiple integrated circuit devices such as flip chip dies are mounted on the package carrier 604, the present invention provides an underfill process without requiring careful placement of the dispenser tip 504 of FIG. 5 at the sides or corners of the flip chip dies. This decreases manufacturing cycle times, and increases productivity in flip chip assembly. However, the integrated circuit package system 600 includes an underfill channel, such as the first channel 602 or the second channel 626, which can guide the flow of the underfill material 502 once it is dispensed, thereby making the quality of the contiguous underfill fillet 614 less sensitive to the exact placement of the dispenser tip 504.

Furthermore, in some cases, an underfill channel may help spread the underfill material 502 reducing or obviating the need to reposition the dispenser tip 504 at the sides or corners of the integrated circuit devices, thereby speeding up the process of forming the contiguous underfill fillet 614. For example, various embodiments of the present invention make it possible to dispense the underfill material 502 continuously at a single location and enable the formation of the contiguous underfill fillet 614 for multiple integrated circuit devices.

In some examples the generation of voids in the contiguous underfill fillet 614 may be reduced. In some cases, this may be based at least in part on the geometry of the underfill channel (s) and/or the positioning of the integrated circuit devices with respect to the underfill channel(s). Other factors may effect the generation of voids such as the positioning of the dispenser tip 504. The contiguous underfill fillet 614 can be formed when the underfill material 502 is dispensed at or near an underfill channel, such as the first channel 602 or the second channel 626. A front representing the interface between the underfill material 502 and the ambient atmosphere forms and progresses between the integrated circuit devices and the package carrier 604 as the underfill material 502 spreads. In some cases, the geometry of the underfill channel(s) and/or the positioning of the integrated circuit devices with respect to the underfill channel(s) may prevent multiple fronts from meeting underneath an integrated circuit device and possibly trapping a bubble of gas. For example, the current invention does not provide for an underfill channel completely encircling the first integrated circuit device.

It is understood that the number of integrated circuit devices shown is an example of the application of this invention. In some cases, more than four integrated circuit devices may be mounted over the package carrier. In some embodiments, a contiguous underfill fillet may be formed under more than four integrated circuit devices.

Furthermore, it is understood that although a first channel and a second channel are illustrated in FIG. 6, additional channels may be formed in the package carrier without completely encircling the first integrated circuit device. In some embodiments, a first channel, a second channel, and any additional channels or combinations thereof may be used to form a contiguous underfill fillet for more than four integrated circuit devices.

Additional channels can be in direct contact with another channel, such as additional channels which are in direct contact with the first channel or the second channel. In order for the additional channels to guide the underfill material, the additional channels must be provided with underfill material. For example, additional channels may be provided with underfill material through a dispenser such as an additional dispenser tip. In some cases, additional channels may be provided with underfill material by another channel such as a first channel, a second channel or other additional channels that are in direct contact with the first channel or second channel.

It is understood that in some cases, additional channels may not be used to guide underfill material. For example, in some cases, additional channels may not be provided with underfill material by a dispenser or channel, but may be used as an overflow reservoir receiving excess underfill material from an adjacent integrated circuit device.

It has been discovered that the present invention provides an integrated circuit package system having improved reliability and manufacturing yields. The configuration of the first channel with respect to the integrated circuit devices results in the improved formation of a contiguous underfill fillet which reduces warpage of the package carrier thereby improving the yield and reliability of the integrated circuit package system.

Yet another important aspect of the present invention is that it valuably supports and services the historical trend of reducing costs, simplifying systems, and increasing performance.

These and other valuable aspects of the present invention consequently further the state of the technology to at least the next level.

Figure 7:
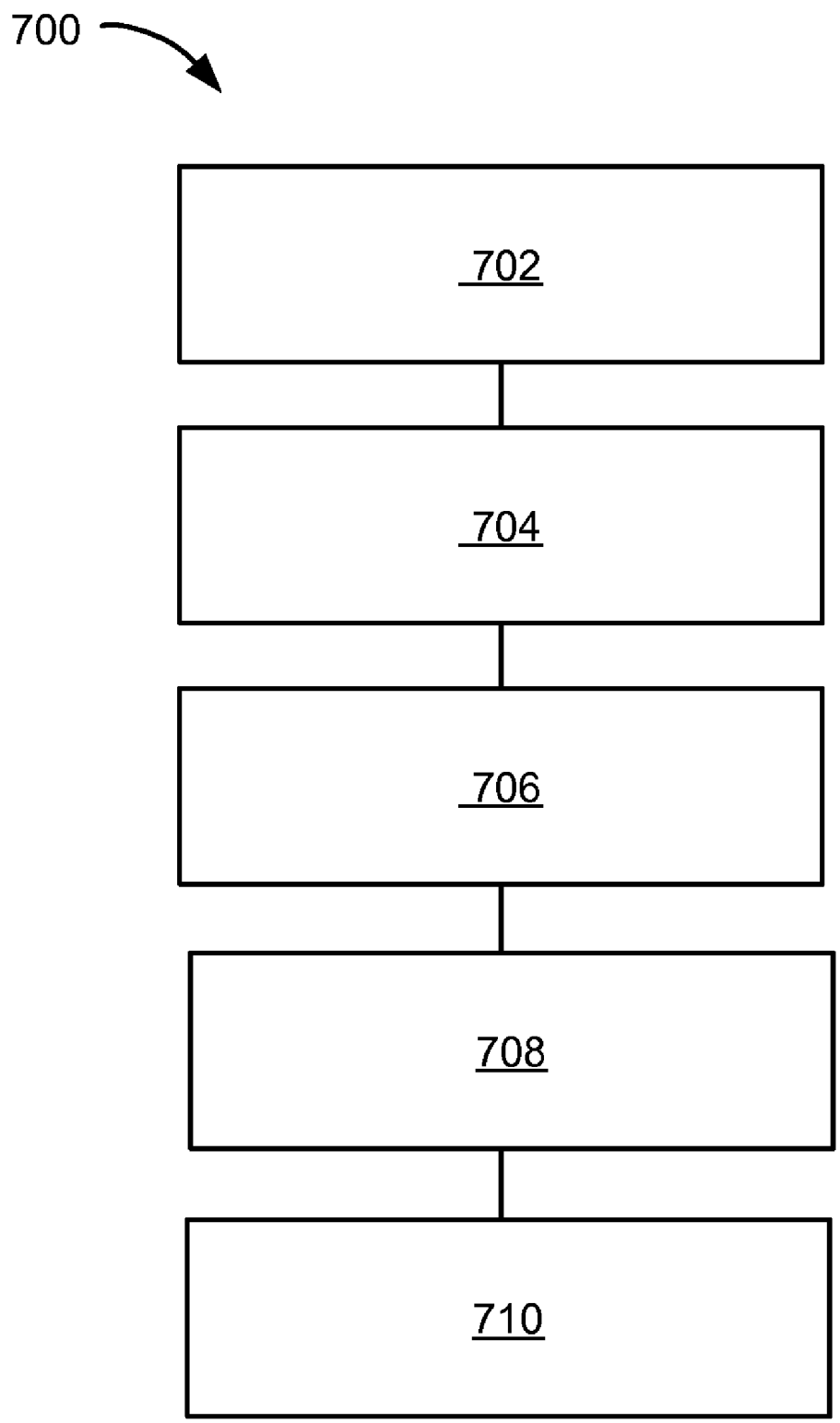
FIG. 7 is a flow chart of an integrated circuit package system for manufacturing an integrated circuit package system with underfill in an embodiment of the present invention.

Referring now to FIG. 7, therein is shown a flow chart of an integrated circuit package system 700 for manufacturing the integrated circuit package system 100 with underfill in an embodiment of the present invention. The system 700 comprises providing a package carrier in a block 702; forming a first channel in the package carrier in a block 704; mounting a first integrated circuit device over the package carrier and adjacent to the first channel in a block 706; mounting a second integrated circuit device over the package carrier and adjacent to the first channel in a block 708; and forming a contiguous underfill fillet with the first channel and under both the first integrated circuit device and the second integrated circuit device in a block 710.

Thus, it has been discovered that the integrated circuit package system of the present invention furnishes important and heretofore unknown and unavailable solutions, capabilities, and functional aspects for improving yield, increasing reliability, and reducing cost of circuit system.

The resulting processes and configurations are straightforward, cost-effective, uncomplicated, highly versatile, and effective, can be surprisingly and unobviously implemented by adapting known technologies, and are thus readily suited for efficiently and economically manufacturing integrated circuit package systems that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   providing a package carrier;
   forming a first channel in the package carrier;
   forming a second channel in contact with the first channel;
   mounting a first integrated circuit device over the package carrier and adjacent to the first channel;
   mounting a second integrated circuit device over the package carrier and adjacent to the first channel and the second channel; and
   forming a contiguous underfill fillet with the first channel and under both the first integrated circuit device and the second integrated circuit device.

2. The method as claimed in claim 1 wherein mounting the first integrated circuit device over the package carrier and adjacent to the first channel includes mounting a first side of the first integrated circuit device adjacent to the first channel without covering the first channel.

3. The method as claimed in claim 1 wherein mounting the first integrated circuit device over the package carrier and adjacent to the first channel includes mounting the first integrated circuit device over the package carrier and adjacent to the first channel which does not extend beyond a first side of the first integrated circuit device.

4. The method as claimed in claim 1 wherein forming the first channel in the package carrier includes forming the first channel with a solder resist of the package carrier.

5. A method for manufacturing an integrated circuit package system comprising:
   providing a package carrier;
   forming a first channel in contact with a second channel in the package carrier with the second channel substantially perpendicular to the first channel;
   mounting a first integrated circuit device over the package carrier and adjacent to the first channel;
   mounting a second integrated circuit device over the package carrier and adjacent to the first channel and the second channel; and
   forming a contiguous underfill fillet over the first channel and the second channel and under both the first integrated circuit device and the second integrated circuit device.

6. The method as claimed in claim 5 wherein mounting the first integrated circuit device over the package carrier and adjacent to the first channel includes mounting a first side of the first integrated circuit device adjacent to the first channel without covering the first channel and the second channel.

7. The method as claimed in claim 5 wherein mounting the first integrated circuit device over the package carrier and adjacent to the first channel includes mounting the first integrated circuit device over the package carrier and adjacent to the first channel which does not extend beyond a first side of the first integrated circuit device.

8. The method as claimed in claim 5 wherein forming the first channel in contact with the second channel includes forming the first channel and the second channel with patterned solder resist.

9. The method as claimed in claim 5 further comprising mounting a third integrated circuit device over the package carrier and adjacent to at least one of the first channel and the second channel.

10. An integrated circuit package system comprising:
    a package carrier having a first channel and a second channel in contact with the first channel;
    a first integrated circuit device mounted over the package carrier and adjacent to the first channel;
    a second integrated circuit device mounted over the package carrier and adjacent to the first channel and the second channel; and
    a contiguous underfill fillet over the first channel and under both the first integrated circuit device and the second integrated circuit device.

11. The system as claimed in claim 10 wherein the first integrated circuit device is over the package carrier and adjacent to the first channel without covering the first channel.

12. The system as claimed in claim 10 wherein the first integrated circuit device is over the package carrier and adjacent to the first channel which does not extend beyond a first side of the first integrated circuit device.

13. The system as claimed in claim 10 wherein the first channel includes a solder resist.

14. The system as claimed in claim 10 wherein:
    the package carrier includes the second channel in contact with the first channel and the second integrated circuit device is adjacent to the second channel; and
    the contiguous underfill fillet is over the second channel.

15. The system as claimed in claim 14 wherein the second channel includes a solder resist.

16. The system as claimed in claim 14 further comprising a third integrated circuit device over the package carrier and adjacent to at least one of the first channel and the second channel.

17. The system as claimed in claim 14 further comprising external connective elements attached to a bottom side of the package carrier.

18. The system as claimed in claim 14 further comprising:
    a third integrated circuit device over the package carrier and adjacent to at least one of the first channel and the second channel; and
    wherein the contiguous underfill fillet is under the third integrated circuit device.

* * * * *